United States Patent
Coyne et al.

(10) Patent No.: US 7,987,063 B2
(45) Date of Patent: Jul. 26, 2011

(54) FAST, LOW POWER FORMATTER FOR AUTOMATIC TEST SYSTEM

(75) Inventors: David Coyne, Fife (GB); Igor Abrosimov, Midlothian (GB)

(73) Assignee: Teradyne, Inc., North Reading, MA (US)

( * ) Notice: Subject to any disclaimer, the term of this patent is extended or adjusted under 35 U.S.C. 154(b) by 356 days.

(21) Appl. No.: 12/107,548

(22) Filed: Apr. 22, 2008

(65) Prior Publication Data

US 2009/0261872 A1    Oct. 22, 2009

(51) Int. Cl.
*G01D 5/14* (2006.01)
*G01D 18/00* (2006.01)
*G01R 1/20* (2006.01)
*G01R 17/14* (2006.01)

(52) U.S. Cl. ......... 702/108; 702/110; 702/117; 702/120

(58) Field of Classification Search .................... 702/66, 702/85, 121, 123, 124, 179, 183, 189; 324/76.82; 327/78; 714/726, 744
See application file for complete search history.

(56) References Cited

U.S. PATENT DOCUMENTS

| | | | |
|---|---|---|---|
| 4,686,391 A * | 8/1987 | Gudaitis | 327/78 |
| 4,807,147 A * | 2/1989 | Halbert et al. | 702/66 |
| 5,270,582 A | 12/1993 | Brown et al. | |
| 5,280,486 A | 1/1994 | Arkin et al. | |
| 5,428,626 A * | 6/1995 | Frisch et al. | 714/744 |
| 5,604,751 A | 2/1997 | Panis | |
| 5,854,797 A | 12/1998 | Schwartz et al. | |
| 6,291,981 B1 * | 9/2001 | Sartschev | 324/76.82 |
| 6,687,865 B1 * | 2/2004 | Dervisoglu et al. | 714/726 |
| 6,771,061 B2 | 8/2004 | Sartschev et al. | |
| 6,831,473 B2 | 12/2004 | Iorga | |
| 6,894,552 B2 | 5/2005 | Iorga et al. | |
| 7,222,041 B2 | 5/2007 | Iorga | |

* cited by examiner

*Primary Examiner* — Michael P Nghiem
*Assistant Examiner* — Felix E Suarez
(74) *Attorney, Agent, or Firm* — Wolf, Greenfield & Sacks, P.C.

(57) ABSTRACT

Automated test equipment (ATE) used to test semiconductor components during the manufacturing process. The ATE generates and measures signals at test points of a device under test. The ATE includes a signal formatter with an SR latch having set an reset inputs each connected through or coupled to a number of signal channels. Each signal channel may receive a long pulse from a timing generator and generate a short pulse. Each signal channel has a current steering circuit that couples the short pulses to the set or reset ports of the latch. Because the outputs of each current steering circuit have a high impedance when not sending a pulse, multiplexing circuitry and/or circuitry to logically OR the outputs of separate signal channels are unnecessary. The hardware eliminated by this design simplifies and improves the ATE. Additionally, the latch can be set and reset in quick succession with good timing resolution.

27 Claims, 5 Drawing Sheets

US 7,987,063 B2

FAST, LOW POWER FORMATTER FOR AUTOMATIC TEST SYSTEM

BACKGROUND

1. Field of the Invention

The invention relates generally to automatic test equipment for testing electronic devices and more particularly to testing devices that operate with high speed digital signals.

2. Description of Related Art

Automatic test equipment (ATE) is widely used to test semiconductor components during the manufacturing process. The ATE, sometimes called a "tester," generates stimulus signals and measures responses for a semiconductor device under test (DUT). The measured responses are compared to responses expected from a fully functioning device. The comparison between the measured response and expected response may be used to determine if the DUT is operating within design tolerances.

FIG. 1 shows a prior art test system in simplified block diagram form. The system includes tester body 100 and computer workstation 200. Computer workstation 200 provides a user interfaces and controls the operation of the tester body 100.

Within the tester body 100, there are multiple copies of circuitry called a channel. In FIG. 1, three channels, 110, 110-B, and 110-C, are shown. Each channel generates or measures a signal at one test point in time for the DUT. Each channel includes a pattern generator 120, timing generator 130, failure processor 140, formatter 150, driver 160, and comparator 170.

Pattern generator 120 stores a pattern that defines the data that is to be applied or is expected during each clock cycle of tester operation. The data specifies whether the tester is to drive data or measure data during each clock cycle. The pattern also includes information specifying the data value, such as logic 1 or logic 0 that is to be driven or is expected from a measurement.

To accommodate use of the test system with a variety of DUTs, which may represent 1's or 0's in different formats, the format of a test signal may be specified by a formatter 150. The formatter responds to format data that specifies how logical values, for example 0's and 1's, are to be driven or read from the DUT. For example, some devices represent a logic 1 by having a signal line at a high voltage during an entire cycle. Other devices represent a logic 1 by changing the state of the voltage at any point during a cycle. Still others represent a logical 1 by a voltage pulse during the cycle.

To provide signal transitions at the proper times, a channel includes a timing generator 130 that generates "edge" signals. Edge signals are signals that change state at a time programmed into the timing generator. The time transition occurs at any time between two tester cycles. A timeset is used to specify the specific time between the two tester cycles.

The edge signals are combined by the formatter 150 to produce an output signal having the desired shape with respect to voltage and time. For example, to create a pulse that starts 0.5 nanoseconds after the start of the cycle, and has a width of 1 nanoseconds, one of the edge signals would be programmed to occur 0.5 nanoseconds after the start of the cycle, and another edge signal would be programmed to occur at 1.5 nanoseconds after the start of the cycle. The formatter combines these signals to create the desired signal to be applied to driver 160. Driver 160 then produces the signal that is applied to the DUT. In this example, formatter 150 uses the first edge to define when driver 160 is turned ON and the second edge to define when driver 160 is turned OFF.

Traditionally, a formatter uses a circuit called an SR latch or SR flip-flop. An SR latch has a set port and a reset port. When a logic high signal is applied to the set port, the output, Q, of the latch is high. When a logic high signal is applied to the reset port, the output, Q, of the latch is low. When both ports receive a logic low signal, the output, Q, holds its state, and may be avoided in operation. Asserting the set and reset port simultaneously may lead to an indeterminate output state, and it is avoided in some implementations. However, U.S. Pat. No. 6,291,981 describes a latch with a deterministic output state in this scenario.

In a tester, format data from pattern generator 120 controls which edges are applied to the SR latch in each cycle. For example, in a cycle in which channel 110 should output a signal that goes high at 0.5 nanoseconds and low at 1.5 nanoseconds, format data that goes high at 0.5 nanoseconds is to be gated to the set port of the latch. Separately, specify that an edge that goes high at 1.5 nanoseconds is gated to the reset port of the latch.

Using multiple edge signals that can all be programmed to occur at different times, the tester can be programmed to generate a wide range of waveform formats.

SUMMARY

An automatic test system having a fast, low power formatter is provided.

In some aspects, the invention relates to a formatter for use in an automatic test system. The formatter generates a signal based on a plurality of timing signals from timing circuitry. The formatter has a latch, the latch having a first port and a second port. The formatter also has a plurality of signal paths, each with a switching circuit. The switching circuit has a signal input, control input, a first output and a second output. The signal input is coupled to the timing circuitry to receive a timing signal of the plurality of timing signals. The first output of a switching circuit is connected to the first port of the latch. The second output of a switching circuit is connected to the second port of the latch. The switching circuit is adapted to alter a signal at its first or second output in response to a signal at the signal input, such that the output is selectively altered in response to a signal at the control input.

In another aspect, the invention relates to a method of operating a test system. In the method a first pulse signal at an input of a first signal path is generated, said first pulse signal comprised of one or more pulses. A second pulse signal at an input of a second signal path is generated. Each pulse in the first pulse signal is selectively delayed. A pulse of the one or more pulses from the first pulse signal is selectively applied to an output of the first signal path. A first current flowing from the output of the first signal path and a second current flowing from an output of the second signal path are combined at an input of the latch.

In yet another aspect, the invention relates to an automatic test system. The automatic test system has an SR latch and a plurality of signal paths. The SR latch has a set port and a reset port. Each signal path has a pulse shrinking circuit and a current steering circuit. The pulse shrinking circuit has a pulse shrinking circuit output and a pulse shrinking circuit input. The pulse shrinking circuit is adapted to transmit at the pulse shrinking circuit output a short pulse signal after receiving a long pulse signal at the pulse shrinking circuit input. The short pulse signal has a narrower pulse width than the long pulse signal. The current steering circuit has a first input, a second input, a first output, and a second output. The current steering circuit is adapted to receive the short pulse signal at the first input, receive a format signal at the second input, and steer the short pulse signal to a first output if a format signal is in a first state, and to steer the short pulse signal to a second output if the format signal is in a second state, wherein the first output of the current steering circuit is wired to the set port of the SR latch forming a first wired OR, and the second output the current steering circuit is wired to the second port of the SR latch, forming a second wired OR.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings.

DETAILED DESCRIPTION

A fast, low-power automated test system is provided through the use of an improved formatter. The formatter may be implemented in CMOS, or any other suitable technology, which allows the formatter to draw low power and to be integrated into the same semiconductor devices used to implement timing generators or other portions of a test system. The inventors have appreciated that fast test and low power operation may be achieved with simple and low power formatter circuitry that can combine multiple edge signals to generate a formatted output signal.

In some embodiments of the invention, the formatter has multiple signal paths, each path providing a timed edge signal in the form of a narrow pulse. Each pulse signal may be selectively coupled to either the set or reset port of an SR latch based on format data. The SR latch is set at times corresponding to the logical ORing of the narrow pulse signals that have been selected for coupling to the set port. Similarly, the SR latch is reset at times corresponding to the logical ORing of the narrow pulse signals that have been selected for coupling to the reset port. By using simple circuitry to combine edge signals in this way, the formatted output signal may have multiple state transitions per cycle, allowing the tester to generate signal for testing high-speed devices yet the simple circuitry consumes low power.

Figure 2:
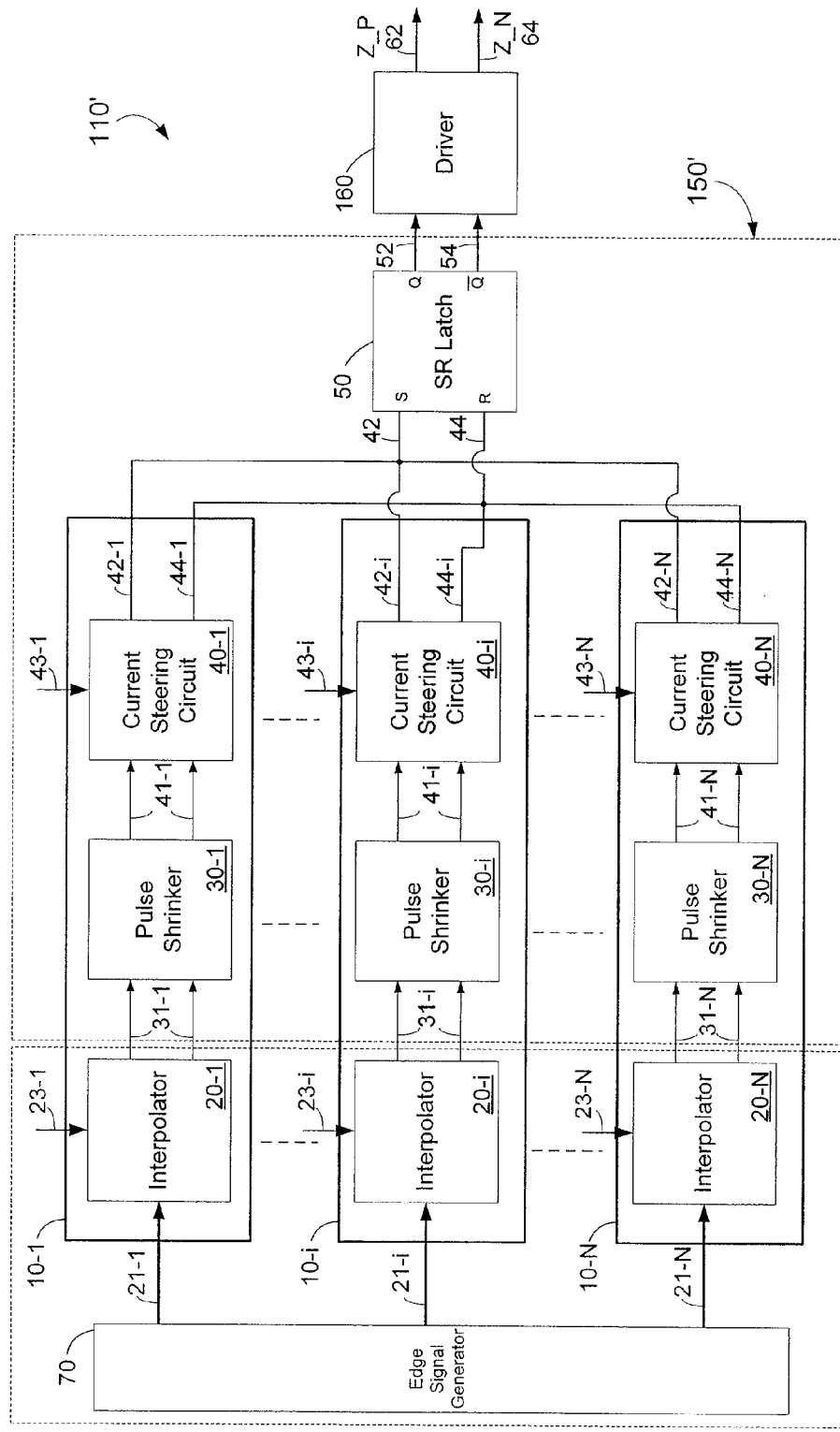
FIG. 2 is a block diagram of a portion of a channel of an automatic test system according to some embodiments of the invention, the portion comprising parts of the timing generator, the formatter and the driver, and comprising N signal paths.

FIG. 2 shows a portion of an ATE system according to an embodiment of the invention. Specifically, the portion shown is part of a channel 110' comprising timing generator 130 and driver 160 which may be as in a known test system. Here formatter 150' differs from a known formatter design. As in a known tester, timing generator 130 provides edge signals at programmed times. Formatter 150' combines edge signals into a signal of a desired format. Driver 160 is connected to a test point of the DUT associated with channel 110'. However, the output of formatter 150' may be used to drive a comparator or used in any other suitable way.

In the example of FIG. 2, channel 110' has a total of N signal paths, 10-1 to 10-N. In the embodiment illustrated, the signal paths 10-1 to 10-N are the same. However, the specific construction of each signal path is not critical to the invention and any suitable construction may be used for the signal paths.

Each signal path 10-1 . . . 10-N has an input 21-1 . . . 21-N connected to edge signal generator 70, which is part of timing generator 130. In the embodiment illustrated, each signal path 10-1 . . . 10-N may receive and process an edge signal.

These edge signals are combined, according to format data 43-1 . . . 43-N and form inputs to SR latch 50.

Outputs 42-1 . . . 42-N from signal path 10-1 to 10-N are connected to the set port 42 of SR latch 50, and outputs 44-1 . . . 44-N are connected to reset port 44.

In some embodiments, the connection of the plurality of outputs 42-1 to 42-N to the set port 42 of SR latch 50 forms a wired OR. A wired OR connection allows outputs of signal paths 10-1 . . . 10-N to be connected directly to input ports 42 and 44 of SR latch 50 without intervening buffers or logic gates. Such a connection is possible even though the circuitry of FIG. 2 may be implemented on a CMOS integrated circuit because of the design of the output stage of signal paths 10-1 . . . 10-N and the input stage of SR latch 50. In the embodiment illustrated, the output stage of each signal path is implemented as a current steering element that may either sink current or present a high impedance, depending on the state of the signal in the signal path to be "ORed" with outputs of other signal paths. Also, the inputs to SR latch 50, even though SR latch 50 may be implemented in CMOS, are coupled to pull-up components. An example embodiment of CMOS circuitry that can form a wired or connection is provided below in FIG. 4. Similarly, in some embodiments, the connection of the plurality of outputs 44-1 to 44-N to the reset port 44 of SR latch 50 forms a wired OR.

Taking signal path, such as signal path 10-i as representative, each signal path, may comprise circuit components that generate a set or reset control input to SR latch 50. In the example illustrated, signal path 10-i includes interpolator 20-i, pulse shrinker 30-i, and current steering circuit 40-i. Interpolator 20-i may be an interpolator as is known in the art. An example implementation of pulse shrinker 30-i and current steering circuit 40-i is provided in conjunction with FIG. 4 below. In other embodiments, different or additional components may be connected in the signal path or components may be connected in a different order. For example, the interpolator may follow the pulse shrinker. As another example, the interpolator may not be present in some signal paths. Accordingly, the specific circuit components in each signal path are not critical to the invention and any suitable components may be used.

Figure 1:
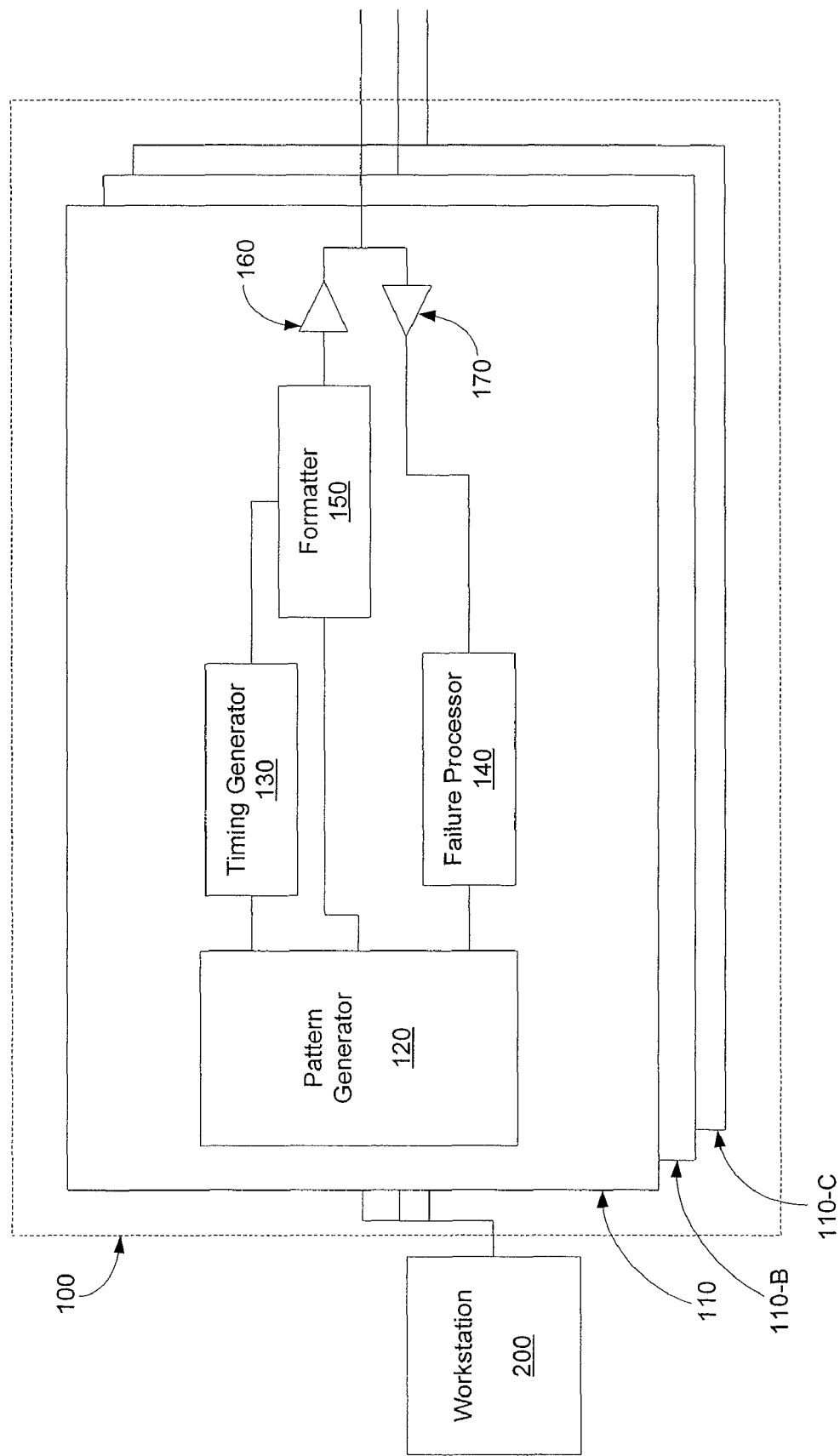
FIG. 1 is a block diagram of a prior art automatic test system.

In signal path 10-i, the timing of an edge pulse is controlled by edge signal generator 70 and an interpolator 20-i. Each of these components may be CMOS components as is known in the art, though any suitable components may be used. Interpolator 20-i selectively delays an edge signal received via signal path input 21-i from edge signal generator 70 according to delay information received via delay input 23-i. The delay information may be written to delay input 23-i by pattern generator 120 (FIG. 1) or any other suitable source.

In the embodiment illustrated, interpolator 20-i outputs an edge signal in the form of a pulse. The rising edge of the pulse signal represents the timing edge and occurs at a time specified by information written to delay input 23-i in conjunction with other timing data that may be applied to timing generator 130. Accordingly, the output of interpolator 20-*i* may be regarded as a delayed edge signal, with the amount of delay being used to control the time at which the edge signal is input to formatter 150'.

Within formatter 150', the delayed edge signal output by interpolator 20-*i* may be coupled to pulse shrinker input 31-*i*. Pulse shrinker 30-*i* outputs a short pulse in response to the delayed edge signal received via pulse shrinker input 31-*i*. In some embodiments pulse shrinker 30-*i* may be a monostable multivibrator as is known in the art. Such a circuit has a stable output state. In response to an input, the output state may change from its stable state. However, once the output state changes, its state is no longer stable and the output state will quickly revert to the stable state. Consequently, the output state pulses in response to an input.

The duration of the pulse output by pulse shrinker 30-*i* depends on the characteristics of pulse shrinker circuit 30-*i*, allowing pulse shrinker circuit 30-*i* to output a relatively narrow pulse, regardless of the duration of a pulse or other signal format output by interpolator 20-*i*. The timing of the output of pulse shrinker 30-*i* is driven by the timing of a signal input to pulse shrinker 30-*i*. The width of the output pulse may be controlled by the design of pulse shrinker 30-*i*. In some embodiments, the duration of the pulse will be long enough to ensure that a pulse, after propagation through current steering circuit 40-*i*, is long enough to activate SR latch 50. Otherwise, the pulse may be as short as practical. However, pulse shrinker 30-*i* may be implemented in any suitable way.

In the embodiment illustrated, a "pulse shrinker" circuit is used because the output of interpolator 20-*i* may be a pulse. However, a monostable multivibrator may respond to inputs of other types. The pulse shrinker may output a short pulse in response to a signal containing any suitable feature of the delayed edge signal. The feature may be a rising edge, a falling edge, the crossing of a threshold, or any other feature of the delayed edge signal.

In some embodiments, the input delayed edge signal and output short pulse may have associated pulse widths. In some such embodiments, the pulse width of the short pulse is shorter than the pulse width of the delayed edge signal.

The pulse shrinker output may be coupled to current steering circuit input 41-*i*. Current steering circuit 40-*i* receives a short pulse from pulse shrinker 30-*i* and may for a short time sink current at an output 42-*i* or 44-*i*, selectively depending on control inputs provided to current steering circuit 40-*i*. The length of time that current steering circuit 40-*i* sinks current may depend on the duration of the pulse output by pulse shrinker 30-*i*. Which output 42-*i* or 44-*i* sinks current may depend on the format data received via format input 43-*i*.

The format data specifies the effect on the output of formatter 150' of an edge output by interpolator 20-*i*. In the embodiment illustrated, the format data may indicate whether, at a time dictated by the edge output by interpolator 20-*i*, the output of SR latch 50 should be set in a high output state or reset to a low output state. In the embodiment illustrated in FIG. 2, when format data 43-*i* indicates that the edge produced by interpolator 20-*i* should cause the output of formatter 150' to transition to a high state, current steering circuit 40-*i* briefly sinks a current pulse at its output 42-*i*, causing a state at input port 42 that sets SR latch 50. Conversely, when format data 43-*i* indicates that an edge output by interpolator 20-*i* should cause the output of formatter 150' to transition to a low state, current steering circuit 40-*i* produces a current pulse at output 44-*i* that places input port 44 into a state that resets SR latch 50.

When current steering circuit 40-*i* produces a current pulse at its output 42-*i* when SR latch 50 is already in a set state, the state of SR latch 50 does not change. SR latch 50 may be in a set state, either because of a prior pulse at output 42-*i* or a prior output pulse at any of the corresponding outputs 42-1 . . . 42-N in any of the signal paths 10-1 . . . 10-N, all of which are similarly coupled to input port 42 through a "wired OR" connection. Conversely, if SR latch 50 is already in a reset state when current steering circuit 40-*i* produces a current pulse at output 44-*i*, SR latch 50 retains its reset state. SR latch 50 may be in a reset state because of a prior current pulse on output 44-*i* or a corresponding output 44-1 . . . 44-N in any of the signal paths 10-1 . . . 10-N, all of which are similarly coupled to input port 44 through a "wired OR" connection.

In the embodiment illustrated, edge signal generator 70 and interpolator 20-1 . . . 20-N may be programmed so that signals applied at set input port 42 and reset input port 44 of SR latch 50 are not simultaneously asserted. Reducing the width of pulses produced by pulse shrinker circuits 30-1 . . . 30-N decreases the likelihood that a pulse may simultaneously be applied to set input port 42 and reset input port 44. However, in embodiments in which SR latch 50 exhibits a suitable behavior in response to signals asserted at both set input port 42 and reset input port 44, it may not be necessary to program edge signal generator 70 and interpolators 23-1 . . . 23-N to avoid overlapping pulses at set input port 42 and reset input port 44.

The format data received by current steering circuit 40-*i* via format input 43-*i* may be generated by pattern generator 120 or any other suitable source. Format data may be encoded or transmitted in any suitable form. For example, in some embodiments format data may be transmitted serially as a binary code. In other embodiments, the information may be transmitted in parallel. In some embodiments the format data is transmitted as a differential signal. In yet other embodiments an analog signal may be used.

Regardless of the programming used in each signal path 10-1 . . . 10-N, the set or reset state of SR latch 50 may be used to control the value output by channel 110' at any given time. The output, Q 52, of SR latch 50 adopts the state associated with the asserted port, taking on a high state if set port 42 is asserted or a low state if reset port 44 is asserted.

In the embodiment illustrated, the output of formatter 150' controls a drive signal. The outputs Q 52 and not Q 54 of SR latch 50 are connected to driver 160, which generates a drive signal corresponding to the state of the SR latch outputs. SR latch outputs Driver output Z_P 62 and Z_N 64, here shown as a differential signal, may be coupled to a DUT or other test point. In the embodiment illustrated, driver 160 has a differential output. In some embodiments, a single ended driver may be used and only one of Z_P 62 and Z_N 64 may be connect to a DUT test point. In some embodiments, only one of Z_P 62 and Z_N 64 may be generated.

In the embodiment illustrated in FIG. 2, formatter 150' provides an output that controls a signal driven to a device under test. In other embodiments, formatter 150' may alternatively or additionally be coupled to a comparator. The comparator may measure a signal received from a device under test in a window defined by the output of formatter 150'. Accordingly, the specific function controlled by the output of formatter 150' is not a limitation of the invention.

Having provided an overview of the operation of the part of formatter 150', an embodiment having four signal channels is used to illustrate an example of operation.

Figure 3:
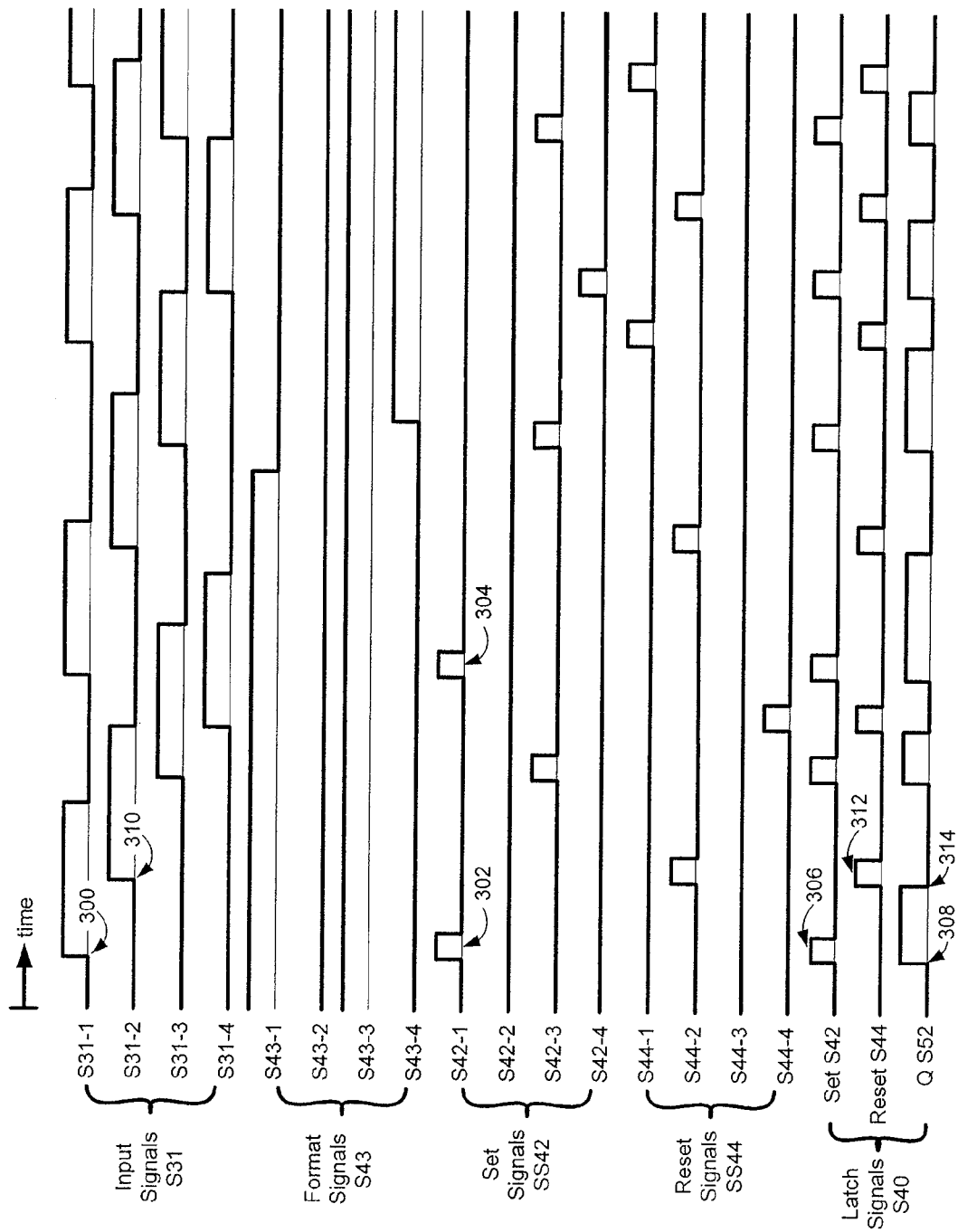
FIG. 3 is a timing diagram for signals generated on the channel of the automatic testing system illustrated in FIG. 2.

FIG. 3 is a timing diagram illustrating input signals, internal signals, and output signals of signal paths 10-1 . . . 10-4 during the operation of channel 110'. The signals are grouped into input signals S31, format signals S43, set signals SS42, reset signals SS44, and latch signals S40.

The signals shown in FIG. 3 may be observed on the inputs and outputs of similar reference designation of the signal channels in FIG. 2. For example input signal S31-1 may be observed on input 31-1 of signal path 10-1.

Each signal in FIG. 3 may take an asserted "high" state, or an unasserted "low" state. The high state is indicated by a thick line raised above the thin guide line, while the low state is indicated by a thick line imposed over the guide line. Such a representation may correspond to relative voltage levels. In the example circuit of FIG. 2, some signals are represented as differential signals. Accordingly, a high signal may correspond to relative voltage levels on two conductors rather than an absolute voltage level. These signaling methods are exemplary, however, and any suitable signaling method may be used in embodiments of the invention, including, for example, using a lower voltage to represent a "high" state.

In this example, input signals S31-1, S31-2, S31-3, and S31-4 are generated by interpolators, such as interpolators 20-1 . . . 20-N (FIG. 2) from signals produced by edge signal generator 70. Each input signal may contain multiple edge signals. In the embodiment of this example, the input signals contain relatively wide pulses, with the leading edge of each pulse, i.e., the transition from the low state to high state, acting as a triggering edge. In the embodiment of FIG. 2, the output of pulse shrinker circuits 30-1 . . . 30-N may similarly be in the format of a pulsed signal, but having a narrower width than the pulses indicated in signals S31-1 . . . S31-4. For simplicity, output signals produced by pulse shrinker circuits 30-1 . . . 30-N are not expressly shown. However, set signals S42-1 . . . S42-4 and reset signals S44-1 . . . S44-4 are shown with a narrower pulse width than input signals S31-1 . . . S31-4, reflecting the operation of pulse shrinker circuits 30-1 . . . 30-N. This type of edge signal is exemplary, and any other suitable edge signal or trigger signal formats may be used in embodiments of the invention.

Four edges are illustrated in input signal S31-1 during the time period shown. Similarly, three edges are illustrated in each of inputs S31-2, and S31-3. Two edges are illustrated on input S31-4.

Format signals S43 are shown as signals S43-1, S43-2, S43-3, and S43-4. Pulses received at a current steering circuit 40-$i$ while the format signal is in a high state are "steered" within corresponding current steering circuits 40-$i$ to cause current to flow into the set output 42-$i$. In contrast, pulses received while the format signal is in a low state are "steered" to the reset output 44-$i$ (FIG. 2).

In the example, format signal S43-1 transitions from high to low during the time period shown. Edge signals received prior to the transition are steered to the set port 42 of latch 50, while edge signals received after the transition are steered to the reset port 44 of latch 50 (FIG. 2). Format signal S43-4 transitions from low to high during the time period shown. Edges received prior to the transition are steered to the reset port 44 of latch 50, while edges received after the transition are steered to the set port 42 of latch 50. Format signals S43-2 and S43-3 do not charge during the time illustrated and are in the low state and high state, respectively, during the time period of this example.

Latch signals S40 illustrates the signals received at the set (42) and reset (44) ports of the latch 50 (FIG. 2), labeled S42 and S44, respectively. Latch signals S40 also include an output signal on latch output Q 52, labeled Q S52. Q S52 may be regarded as a single-ended representation of the signal on outputs Z_P 62 and Z_N 64 (FIG. 2).

Each of the latch input signals S42 and S44 may represent the combination of set and reset signals, respectively, produced in the separate signal paths 10-1 . . . 10-4. As illustrated, set signal S42 includes a pulse 306 corresponding to pulse 302. A similar correspondence exists between pulses in set signal S42 and pulse 304 in set signal S42-1. Additionally, set signal S42 includes pulses corresponding to pulses in the other set signals. As illustrated, set signal S42 contains a pulse corresponding to each of the pulses in set signal S42-3 and S42-4. In this way, set signal S42 is the combination of the set signals output in each of the signal paths 10-1 . . . 10-4. In the example of FIG. 3, the pulses in the set signals S42-1 . . . S42-4 are combined through a logical OR operation.

Reset signal S44 is similarly a logical OR of the reset signals output by each of the signal paths. For example, reset signal S44 includes a pulse 312 that corresponds to a pulse in reset signal S44-2. Reset signal S44 includes other pulses, each corresponding to a pulse in a reset signal S44-1 . . . S44-4.

Signal Q S52 indicates the output of the SR latch 50 (FIG. 2). The initial state of the SR latch may be established in any suitable way. In this example it is established as low. At the leading edge of each pulse on set S42, the output Q S52 rises to the high state, while at the leading edge of each pulse on reset S44, the output Q S52 returns to the low state. The signal Q S52 retains its state until another signal changes it.

In the example illustrated, a first edge signal appears on input signal S31-1, with a triggering edge occurring at marker 300. Because format signal S43-1 is high, current steering circuit 40-1 "steers" a pulse to the set port of SR latch 50 via output 42-1. The steered pulse is observed on set signal S42-1 as pulse 302. In this example, pulse 302 is illustrated to be shorter than the input edge signal on S21-1 beginning at marker 300 because of the operation of a pulse shrinking circuit.

Pulse 302 in turn appears as pulse 306 on signal set S42. The pulse 306 causes the output signal Q S52 of the SR latch 50 to switch states from low to high as indicated by marker 308. Notice that Q S52 maintains the high state even after pulse 306 has ended.

The process continues with the next edge appearing in any of input signals S31, which in this example is on signal S31-2. The edge occurs at marker 310 while the corresponding format signal, S43-2, is in the low state (steer to reset port). In response to this edge, pulse 312 is created on the reset port signal S44, which causes output Q S52 to return low as indicated by marker 314.

In some embodiments where the simultaneous excitation of the set and reset ports of the SR latch is a restricted, the time between state changes of output Q S52 may be limited by the pulse width of the applied edges. The use of pulse shrinkers may provide narrower pulses than if input signals S31 were used to trigger the SR latch directly and thus faster refire time for formatter 150'.

Figure 4:
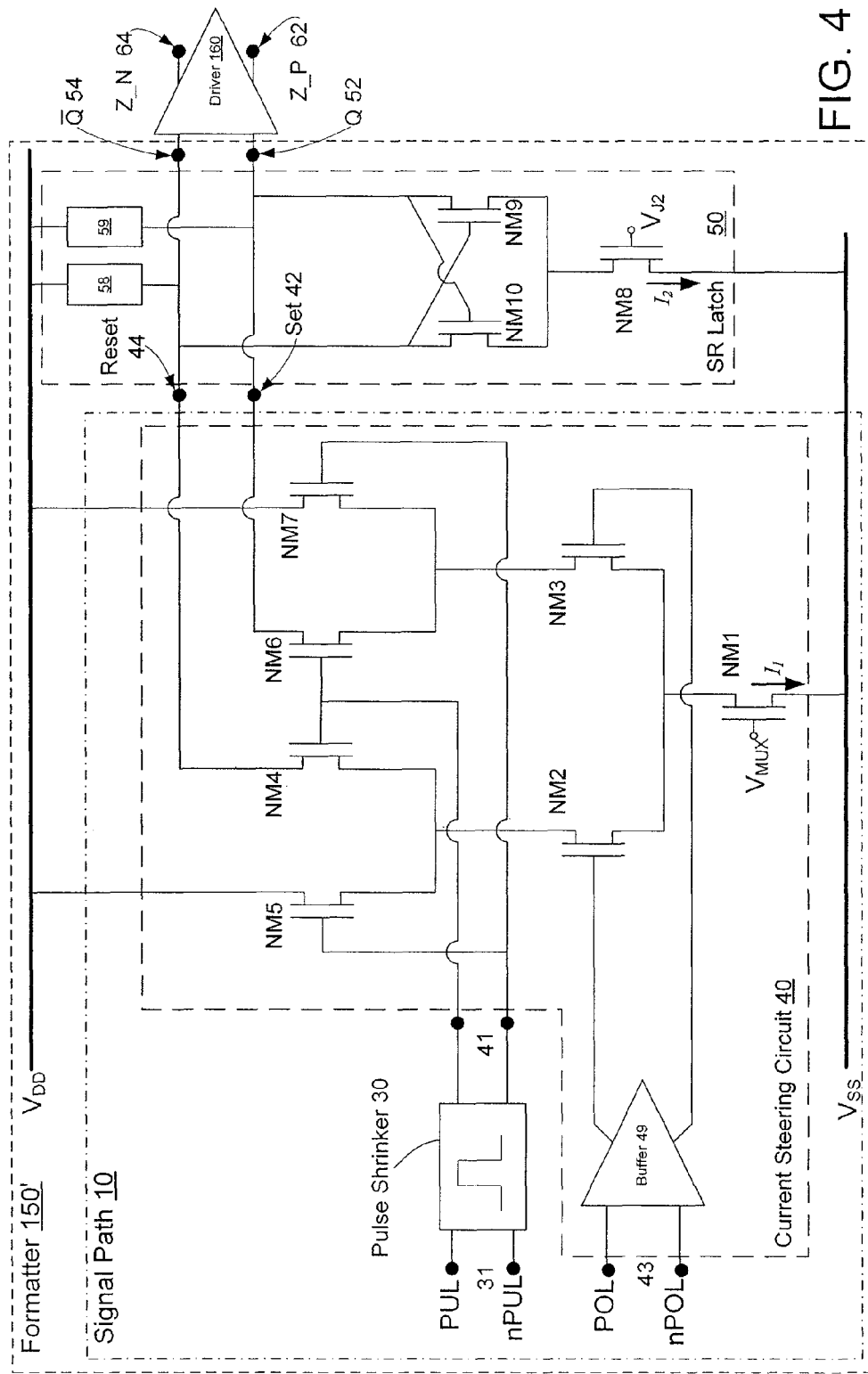
FIG. 4 is a simplified circuit diagram of a current steering circuit and SR latch of the channel of FIG. 2.

Having provided a description of aspects of channel 110' and an illustration of a signaling method used to produce a channel output, an example implementation of the formatter 150' is presented in FIG. 4. Formatter 150' comprises a pulse shrinker 30, current steering circuit 40, and SR latch 50. Driver 160 is also shown. For simplicity, only one signal path 10 is shown. In embodiments of the type shown in FIG. 2, multiple signal paths 10-1 to 10-N in the form of signal path 10 would each be connected to the SR latch 50 at set port 42 and reset port 44.

The circuitry illustrated in FIG. 4 may be implemented using CMOS technology as is known in the art. However, any suitable implementation is possible. The components illustrated in FIG. 4 may be implemented on a single CMOS integrated circuit chip. In such an embodiment, other signal paths, such as 10-1 . . . 10-N illustrated in FIG. 2 forming a portion of formatter 150' may similarly be implemented on the same integrated circuit chip. Timing generator 130 (FIG. 2) may also be implemented in CMOS technology and may be combined on the same integrated circuit chip with formatter 150'. Because of the relatively simple design provided by formatter 150', in some embodiments, timing generators and formatters for multiple channels may be integrated onto the same CMOS integrated circuit chip. In some embodiments, driver 160 may be implemented in a separate integrated circuit chip from a chip containing the formatter and timing generators. However, in embodiments in which a driver is implemented using CMOS technology, the driver may likewise be integrated onto the same integrated circuit chip.

FIG. 4 illustrates pulse shrinker 30 schematically as a block. Any suitable circuitry may be used to implement pulse shrinker 30. In some embodiments pulse shrinker 30 may be implemented as a monostable multivibrator.

The current steering circuit 40 comprises buffer 49. Buffer 49 may be a buffer amplifier as is known in the art. Buffer 49 serves to insure that signals at format data input 43 are applied with the appropriate levels to other components within current steering circuit 40.

In the embodiment illustrated, current steering circuit 40 is constructed from multiple transistors NM1 . . . NM7. Transistor NM1 acts as a current source. Voltage $V_{MUX}$ is provided to the central input of transistor NM1 to provide a suitable sinking current, $I_1$. Voltage $V_{MUX}$ may depend on the exact circuit configuration and may be adjustable for different circuit and signaling conditions. For example, voltage $V_{MUX}$ may be generated with a variable value by a circuit that tracks temperature variations and sets the voltage level to adapt for changes in signal delays caused by temperature variations. Temperature compensated CMOS circuitry is known in the art, and voltage $V_{MUX}$ may be generated using techniques as known in the art.

Transistors NM2 through NM7 will each be "ON" or "OFF" at different times during operation of current steering circuit 40, depending on the signals applied to inputs 41 or 43. Depending on the values at those inputs, current steering circuit 40 will sink an amount of current $I_1$ through either set port 42, reset port 44 or will draw current $I_1$ from the voltage rail $V_{DD}$ such that no current flows into current steering circuit 40 from either set port 42 or reset port 44. When current is drawn through set port 42 or reset port 44, the state of latch 50 may be set, with a current entering current steering circuit 40 through set port 42 causing latch 50 to enter or remain in a set state. Similarly, a current flow into current steering circuit 40 through reset port 44 may cause latch 50 to enter or remain in a reset state.

The switching transistor states of "ON" and "OFF" refer to a substantially conducting state and a high impedance state, respectively. Practical transistors may not form perfect open circuits and short circuits when in the OFF or ON state. Tolerances may exist for all components, which permit a leakage current and small voltage drop across a transistor in the OFF and ON states, respectively.

SR latch 50 comprises pull-up 58, pull-up 59, and transistors NM8 through NM10. Transistor MN8 may act as a current source. Voltage $V_{J2}$ is provided to a central input of transistor NM8 and may have a value that provides a suitable bias current, $I_2$. Voltage $V_{J2}$ may depend on the exact circuit configuration and may be adapted for different circuit and signaling conditions, and, like voltage $V_{MUX}$, may be generated by a temperature compensation circuit.

As illustrated in FIG. 4, transistors NM9 and NM10 are cross-coupled to create a bi-stable memory cell. In the stable states of that cell, one of transistors NM9 or NM10 will be in a conducting state conducting the current $I_2$. Which of the transistors NM9 or NM10 dictates the relative difference in voltage at output ports Q 52 and not Q 54. Accordingly, the state of latch 50 is determined based on which of the transistors NM9 or NM10 is conducting. As described below, this state may be altered when current flows into current steering circuit 40 through either set port 42 or reset port 44. Otherwise, the state is maintained by the voltages applied to transistors NM9 and NM10 through pull-ups 58 and 59. Here, pull-ups 58 and 59 may be implemented using transistors, resistors or other circuit components connected using known design techniques.

Voltages $V_{DD}$ and $V_{SS}$ provide a difference in electrical potential needed to drive formatter 150'.

In operation, format data to control operation of current steering circuit 40 is received via format input 43 of the current steering circuit 40 and is buffered by buffer 49. Input 43 is represented as a differential signal with a POL input and nPOL input.

If the differential signal on format input 43 is asserted (POL having a greater voltage than nPOL) set port 42 is selected to sink current in response to a pulse at input 41. When the format input 43 is asserted, transistor NM2 is turned ON, and the bias current established by transistor NM1 passes primarily to the differential pair of transistors NM4 and NM5. Conversely, transistor NM3 is OFF and substantially no current flows through either of transistors NM6 or NM7.

If the differential signal on format input 43 is not asserted (nPOL having a greater voltage than POL) the reset port 44 is selected. In this state, transistor NM3 is ON and transistor NM2 is OFF. Accordingly, the bias current $I_1$ flows through differential pair of transistors NM6 and NM7 and substantially no current flows through either transistor NM4 or NM5.

Thus, depending on the state of the format signal at input port 43, either differential pair NM4 and NM5 or differential pair NM6 and NM7 will be active. The operation of the active pair will depend on the value of the signal at input port 41. When no signal is asserted at input port 41, either transistor NM5 or NM7 will be ON, depending on which of the differential pairs is active based on the format data input. If differential pair NM4 and NM5 is active, transistor NM5 will be active. As a result, transistor NM5 will pass from $V_{DD}$ a current $I_1$. Substantially no current will flow through transistor NM4. Accordingly, no current flows into current steering circuit 40 through reset port 44. Because differential pair NM6 and NM7 is inactive, no current flows into current steering circuit 40 through set port 42. In this state, current steering circuit 40 does not change the state of SR latch 50.

If the format input data is in the opposite state such that transistor pair NM6 and NM7 is active, the effect of current steering circuit 40 on the state of latch 50 is the same when the signal at input port 41 is not asserted. Namely, differential pair NM4 and NM5 is inactive. Within the active differential pair of transistors NM6 and NM7, transistor NM7 will be ON. The bias current $I_1$ will therefore flow through transistor NM7 and substantially no current will flow into set port 42 because transistor NM6 will be OFF.

When pulse shrinker 30 outputs a pulse such that a signal is asserted at input port 41, current steering circuit 40 will sink current through either set port 42 or reset port 44, depending on the state of the format data input at port 43. When the format data is such that differential pair NM4 and NM5 is active, a pulse at input port 41 causes transistor NM4 to conduct. Accordingly, current flows into current steering circuit 40 through reset port 44. Conversely, when format data at input port 43 causes differential pair NM6 and NM7 to be active, an input signal at port 41 causes transistor NM6 to sink current through set port 42.

In the case the format data indicates the set port is selected, transistors NM2 and NM4 are ON during a pulse asserted at input port 41. Transistors NM3, NM5, NM6 and NM7 are OFF. A low resistance path is created between $V_{SS}$ and reset output 44. The voltage drop is primarily across pull-up 58 such that the voltage associated with reset output 44 is closer to $V_{SS}$ than $V_{DD}$. Because the central input of transistor NM9 is connected to reset port 44, transistor NM9 is forced OFF. Current is restricted through pull-up 59 since all drain paths (42, NM9, and 52) exhibit a high impedance. Thus the voltage associated with set output 42 is closer to $V_{DD}$ than $V_{SS}$. In this state, transistor NM10 is forced ON. With transistor NM10 ON and NM9 OFF, latch 50 is in one of its two stable states. Even after transistor NM4 stops drawing current, latch 50 may remain in this state. Thus, the SR latch 50 has been "set."

In the case the format data indicates the reset port is selected, transistors NM3 and NM6 are ON during a pulse is asserted at input port 41. Transistors NM2, NM5, NM4 and NM7 are OFF. A low resistance path is created between $V_{SS}$ and set output 42. The voltage drop is primarily across pull-up 59 such that the voltage associated with set output 42 is closer to $V_{SS}$ than $V_{DD}$. Transistor NM10 is forced OFF. Current is restricted through pull-up 58 since all drain paths (44, NM10, and 54) exhibit a high impedance. Thus the voltage associated with reset output 44 is closer to $V_{DD}$ than $V_{SS}$. In this state, transistor NM9 is forced ON. In this state, with NM9 ON and NM10 OFF, latch 50 is in a second of its stable states and will remain in this state even after current flow through transistor NM6 stops. Thus, the SR latch 50 has been "reset."

Figure 5:
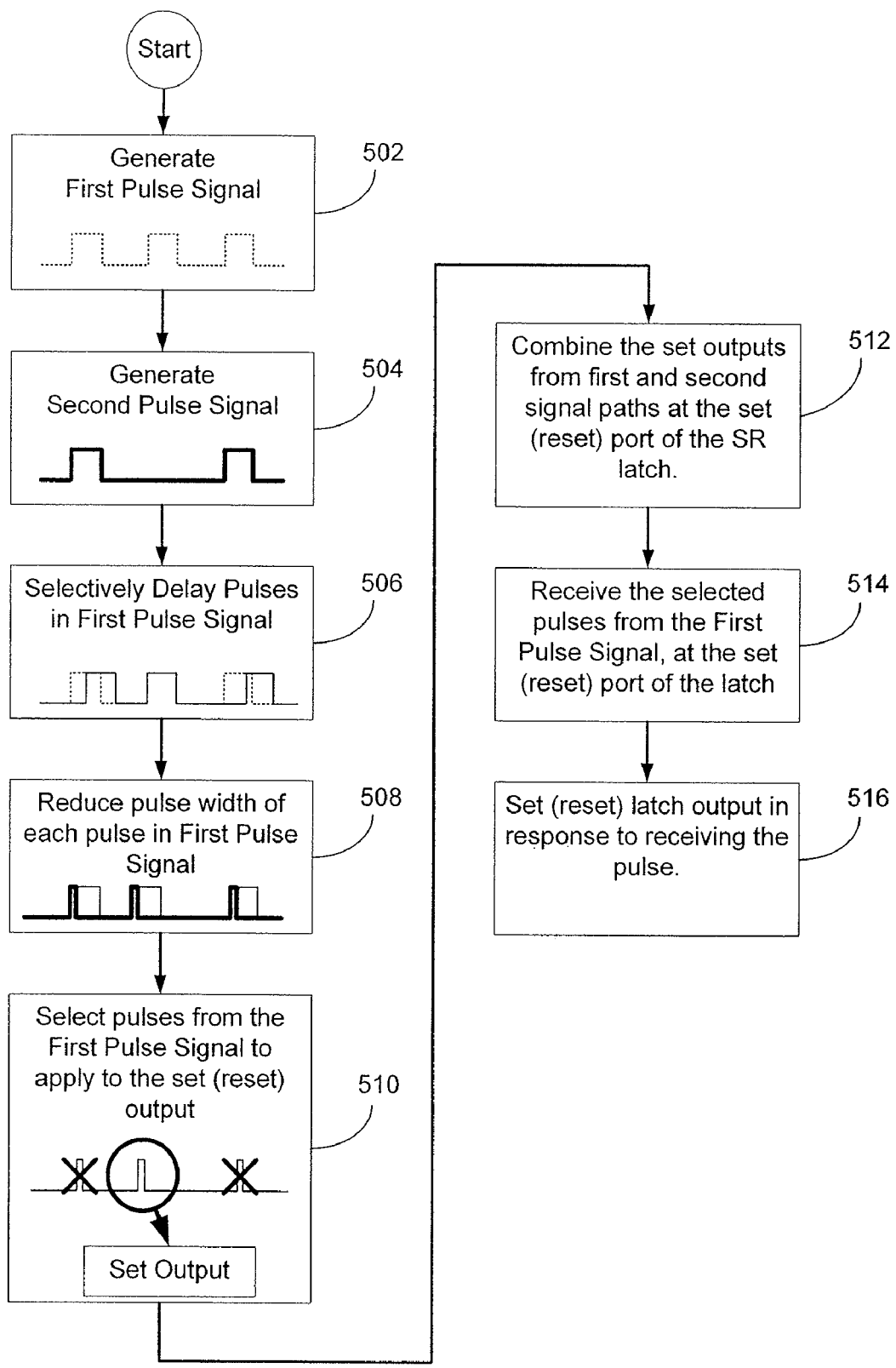
FIG. 5 is a flow chart illustrating a method of operating an automatic test system according to some embodiments of the invention.

FIG. 5 illustrates a method of operating the test system of FIG. 2.

In step 502, a pulse signal is generated. The pulse signal has a series of pulses. The spacing between pulses may be programmed according to the desired timing of edge signals during a test of a semiconductor device. Similarly, in step 504 a second pulse signal is generated. Each of the first and second pulse signals may be generated in a signal path. The signals on inputs 21-1 . . . 21-N (FIG. 2) may serve as examples of the pulse signals generated in steps 502 and 504.

In step 506, the pulse signals generated in step 502 are selectively delayed. In some embodiments, the delay is determined by delay information as may be received by the delay input of an interpolator (see delay input 23-*i* of interpolator 20-*i* in FIG. 2 for example). As shown pictorially in step 506, each pulse in the pulse signal (dashed) may be uniquely delayed.

In step 508, the delayed pulse signals are each reduced in width. In some embodiments a pulse shrinker such as pulse shrinker 30-*i* in FIG. 2 produces the reduced pulse width signal. In some embodiments, pulse shrinking may be performed prior to the selective delay of pulses.

In step 510, it is determined which of the delayed and reduced width pulses in the first pulse signal are to be directed to the set port of the SR latch via the set output of the signal path. In some embodiments, pulses not directed to the set port are directed to the reset port. In other embodiments pulses may be directed to neither port. Equivalently, it may be determined which of the delayed and reduced width pulses in the first pulse signal are to be directed to the reset port of the SR latch via the reset output of the signal path.

Pictorially, the second of the three pulses is indicated as being selected in step 510. However, any or all pulses in the pulse signal may be selected and applied to set or reset an output. In some embodiments the selection is specified by format data.

In step 512, the outputs of the first and second signal paths are combined at the set (or reset) port. In some embodiments the combination is of the form of a wired OR.

In step 514, the selected pulses from the first pulse signal are received at the set (reset) port of the latch.

In step 516, the latch output is set (reset) in response to receiving the pulse.

Having thus described at least one illustrative embodiment of the invention, various alterations, modifications, and improvements will readily occur to those skilled in the art. Such alterations, modifications, and improvements are intended to be within the scope of the invention.

For example, a CMOS embodiment of the invention may provide a low power consumption, highly integrated ATE construction. However, other technologies may be used.

Method and apparatus as described above may be applied in any suitable way. For example, in the manufacture of semiconductor devices, it is desirable to generate test signals applied to devices under test and measure responses produced by those devices to verify that the devices are operating properly. The circuitry and methods described may be used to test semiconductor devices. Information obtained through testing can be used to identify and discard devices that fail to exhibit the expected performance. Test results may alternatively or additionally be used to alter the steps in the process used to make the devices. For example, the devices may be calibrated or modified in subsequent process steps so that they do exhibit expected performance or the devices might be packaged for sale as parts that meet relaxed performance specifications. Alternatively, the results of tests might also be used in a yield enhancement system to change parameters of processing equipment.

Accordingly, the foregoing description is by way of example only and is not intended as limiting. The invention is limited only as defined in the following claims and the equivalents thereto.

What is claimed is:

1. A formatter adapted for use in an automatic test system to generate a signal based on a plurality of timing signals from timing circuitry, the formatter comprising:
   a latch having a first input port and a second input port;
   a plurality of signal paths each arranged between the timing circuitry and the latch, each signal path comprising:
      a switching circuit comprising:
         a signal input coupled to an output of the timing circuitry and configured to receive a timing signal of the plurality of timing signals from the timing circuitry;
         a control input configured to receive a control signal;
         a first output connected to the first input port of the latch; and
         a second output connected to the second input port of the latch;
      the switching circuit being adapted to selectively alter an output signal provided at the first output of the switching circuit or the second output of the switching circuit in response to the control signal being received at the control input, wherein the output signal is generated in response to the timing signal being received at the signal input of the switching circuit.

2. The formatter of claim 1, wherein altering the output signal provided at the first output of the switching circuit or the second output of the switching circuit comprises enabling a current flow into one of the first output of the switching circuit or the second output of the switching circuit.

3. The formatter of claim 1, wherein each of the plurality of signal paths comprises a pulse shrinking circuit,
wherein the switching circuit of each signal path is coupled to the timing circuitry via the pulse shrinking circuit of the signal path, and
wherein the pulse shrinking circuit of each signal path comprises:
an input coupled to the timing circuitry for receiving the timing signal of the plurality of timing signals; and
an output coupled to the switching circuit of the signal path,
the pulse shrinking circuit being adapted to provide at the output of the pulse shrinking circuit, in response to a first pulse of the timing signal having a first pulse width, a second pulse having a second pulse width shorter than the first pulse width.

4. The formatter of claim 3, wherein the pulse shrinking circuit of each signal path is a monostable multivibrator.

5. The formatter of claim 3, wherein the second pulse width is less than 300 picoseconds.

6. The formatter of claim 1, wherein the switching circuit comprises:
a voltage source;
a current source generating a bias current;
a plurality of transistors each having a control input and each of the plurality of transistors being coupled to the current source, the plurality of transistors being adapted and configured to define at least three current paths that selectively conduct the bias current based on the state of control signals coupled to control inputs of the plurality of transistors,
wherein:
at least a first of the at least three current paths is coupled to the first input port of the latch;
at least a second of the at least three current paths is coupled to the second input port of the latch; and
at least a third of the at least three current paths is coupled to the voltage source.

7. The formatter of claim 6, wherein the plurality of transistors comprises:
a first differential pair of transistors;
a first transistor coupling the first differential pair of transistors to the current source;
a second differential pair of transistors;
a second transistor coupling the second differential pair of transistors to the current source,
wherein each of the transistors in the first differential pair and the second differential pair has a control input coupled to the signal input of the switching circuit and each of the first transistor and the second transistor has a control input coupled to the control input of the switching circuit.

8. The formatter of claim 7, wherein the control input of the switching circuit is a differential input having a first leg and a second leg, and the first leg is coupled to the control input of the first transistor and the second leg is coupled to the control input of the second transistor.

9. The formatter of claim 8, wherein the signal input of the switching circuit is a differential input having a first leg and a second leg, and the first leg of the signal input is coupled to a control input of a first transistor in each of the first and second differential pairs and the second leg of the control input is coupled to a control input of a second transistor in each of the first and second differential pairs.

10. The formatter of claim 9, wherein:
the first current path comprises the first transistor of the first differential pair of transistors; and
the second current path comprises the first transistor of the second differential pair of transistors.

11. The formatter of claim 10, wherein the latch comprises a first pull-up coupled to the first port and a second pull-up coupled to the second port.

12. The formatter of claim 11, wherein the latch is a Set Reset (SR) latch.

13. The formatter of claim 12, wherein the Set Reset (SR) latch comprises a cross-coupled transistor pair, a first transistor of the cross-coupled transistor pair being coupled to the first pull-up and a second transistor of the cross-coupled transistor pair being coupled to the second pull-up.

14. The formatter of claim 1, wherein the control signal is received from a pattern generator of the automatic test system.

15. The formatter of claim 1, further comprising a driver having an input coupled to an output of the latch.

16. The formatter of claim 1, wherein at least two signal paths of the plurality of signal paths are coupled to the latch via a wired OR configuration.

17. A method of operating a test system comprising:
generating a first pulse signal at an input of a first signal path of formatter circuitry of the test system, said first pulse signal comprised of one or more pulses;
generating a second pulse signal at an input of a second signal path of the formatter circuitry of the test system, the first signal path and the second signal path each being arranged between timing circuitry of the test system and a latch of the test system;
selectively delaying each pulse in the first pulse signal;
selectively applying a pulse of the one or more pulses from the first pulse signal to an output of the first signal path; and
combining, at an input of the latch, a first current flowing from the output of the first signal path and a second current flowing from an output of the second signal path.

18. The method of claim 17 further comprising:
receiving the pulse from the first pulse signal, at the input of the latch; and
applying at an output of the latch, a state, in response to receiving the pulse.

19. The method of claim 18 wherein:
the pulse in the first pulse signal is a first pulse;
the output of the first signal path is a first output of the first signal path;
the output of the second signal path is a first output of the second signal path;
the input of the latch is a first input of the latch; and
the state is a first state;
the method further comprises:
selectively applying a second pulse from the second pulse signal to a second output of the second signal path; and
combining at a second input of the latch, a third current flowing from the second output of the second signal path and a fourth current flowing from a second output of the first signal path.

20. The method of claim 18, wherein the latch is a Set Reset (SR) latch.

21. The method of claim 17, wherein the first and second signal paths are configured in parallel between the timing circuitry and the latch.

22. An automated test system comprising:
a Set Reset (SR) latch having a set port and a reset port;
a plurality of signal paths, each signal path comprising:
- a pulse shrinking circuit having a pulse shrinking circuit output and a pulse shrinking circuit input, the pulse shrinking circuit adapted to provide at the pulse shrinking circuit output a short pulse signal after receiving a long pulse signal at the pulse shrinking circuit input, wherein the short pulse signal has a narrower pulse width than the long pulse signal; and
- a current steering circuit having a first input, a second input, a first output, and a second output, the current steering circuit adapted to receive the short pulse signal at the first input, receive a format signal at the second input, and steer the short pulse signal to the first output if a format signal is in a first state, and to steer the short pulse signal to the second output if the format signal is in a second state, wherein the first output of the current steering circuit is wired to the set port of the Set Reset (SR) latch forming a first wired OR, and the second output of the current steering circuit is wired to the reset port of the Set Reset (SR) latch, forming a second wired OR.

23. The automated test system of claim 22, wherein each signal path further comprises an interpolator having an edge input, a delay input, and a long pulse output, the interpolator adapted to receive an edge signal at the edge input and generate the long pulse signal at the long pulse output by selectively delaying the edge signal in response to a delay signal received at the delay input.

24. The automated test system of claim 23, wherein the Set Reset (SR) latch further comprises a latch output, the automated test system further comprising:
- a driver for buffering a signal, the driver having a buffer input, a buffer output and adapted to receive at the buffer input a latch output signal from the latch output.

25. The automated test system of claim 22, wherein the current steering circuit further comprises:
- a current source for regulating a current;
- a first discrimination stage for steering the current to a first path when the format signal is in the first state and before the pulse shrinking circuit receives the long pulse signal at the pulse shrinking circuit input, and for steering the current to a second path when the format signal is in the first state and the pulse shrinking circuit is transmitting at the pulse shrinking circuit output the short pulse signal; and
- a second discrimination stage for steering the current to a third path when the format signal is in the second state and before the pulse shrinking circuit receives the long pulse signal at the pulse shrinking circuit input, and for steering the current to a fourth path when the format signal is in the second state and the pulse shrinking circuit is transmitting at the pulse shrinking circuit output the short pulse signal.

26. The automated test system of claim 25, wherein the Set Reset (SR) latch further comprises a latch output, steering the current to the second path causes a latch output signal on the latch output to enter a set state and steering the current to the fourth path causes the latch output signal on the latch output to enter a reset state.

27. The automated test system of claim 22, wherein the plurality of signal paths are arranged in parallel to each other between timing circuitry of the automated test system and the SR latch.

* * * * *